United States Patent
Wikus et al.

(10) Patent No.: US 10,401,447 B2
(45) Date of Patent: Sep. 3, 2019

(54) COOLING DEVICE, COMPRISING A CRYOSTAT AND A COLD HEAD HAVING IMPROVED DECOUPLING TO A COOLING SYSTEM

(71) Applicant: Bruker BioSpin AG, Faellanden (CH)

(72) Inventors: Patrick Wikus, Nuerensdorf (CH); Steffen Bonn, Zurich (CH)

(73) Assignee: BRUKER BIOSPIN AG, Faellanden (CH)

( * ) Notice: Subject to any disclaimer, the term of this patent is extended or adjusted under 35 U.S.C. 154(b) by 210 days.

(21) Appl. No.: 15/487,089

(22) Filed: Apr. 13, 2017

(65) Prior Publication Data

US 2017/0299673 A1   Oct. 19, 2017

(30) Foreign Application Priority Data

Apr. 15, 2016 (DE) .......................... 10 2016 206 435

(51) Int. Cl.
| | | |
|---|---|---|
| *G01V 3/00* | (2006.01) | |
| *G01R 33/38* | (2006.01) | |
| *F25B 9/14* | (2006.01) | |
| *F25D 19/00* | (2006.01) | |
| *G01R 33/3815* | (2006.01) | |

(52) U.S. Cl.
CPC .......... *G01R 33/3804* (2013.01); *F25B 9/145* (2013.01); *F25D 19/006* (2013.01); *F25B 2500/13* (2013.01); *G01R 33/3815* (2013.01)

(58) Field of Classification Search
CPC .................................................. G01R 33/3804

USPC ................................................... 324/318, 319
See application file for complete search history.

(56) References Cited

U.S. PATENT DOCUMENTS

| 5,744,959 | A | 4/1998 | Jeker et al. |
|---|---|---|---|
| 5,864,273 | A * | 1/1999 | Dean ..................... F25D 19/006 335/216 |
| 5,934,082 | A | 8/1999 | Steinmeyer |
| 5,966,944 | A | 10/1999 | Inoue et al. |
| 9,982,840 | B2 * | 5/2018 | Wikus ................ G01R 33/3804 |
| 10,181,372 | B2 * | 1/2019 | Simpkins .................. H01F 6/04 |
| 2005/0229620 | A1 | 10/2005 | Kirichek et al. |
| 2006/0254288 | A1 | 11/2006 | Schlenga |
| 2007/0271933 | A1 | 11/2007 | Miki |

(Continued)

FOREIGN PATENT DOCUMENTS

| DE | 19548273 A1 | 6/1997 |
|---|---|---|
| DE | 102014214819 B3 | 8/2015 |

(Continued)

*Primary Examiner* — Louis M Arana
(74) *Attorney, Agent, or Firm* — Edell, Shapiro & Finnan LLC

(57) ABSTRACT

A cooling device (1) has a cryostat (2) and a cold head (3) of a cooling system (52), and additionally includes a pivot bearing (35), with which the cold head (3) is mounted on the cryostat (2) so as to be rotatable about a rotation axis (A). A connecting line (15) for a working gas of the cooling system (52) is connected to the cold head so that forces caused by the cooling system (52) act on the cold head (3) via the connecting line (15) at a force application point (EP) in a force application direction (ER). The force application direction (ER) is inclined by no more than 40° with respect to the normal (N) of a lever plane (HE) which contains the rotation axis (A) and the force application point (EP).

22 Claims, 7 Drawing Sheets

(56) References Cited

U.S. PATENT DOCUMENTS

| | | |
|---|---|---|
| 2008/0024034 A1 | 1/2008 | Koizumi et al. |
| 2009/0272127 A1 | 11/2009 | Radovinsky et al. |
| 2009/0293505 A1 | 12/2009 | Wang |
| 2012/0073310 A1 | 3/2012 | Radovinsky et al. |
| 2015/0084633 A1 | 3/2015 | Garside et al. |
| 2016/0061382 A1 | 3/2016 | Simpkins |
| 2016/0091142 A1 | 3/2016 | Wikus et al. |

FOREIGN PATENT DOCUMENTS

| | | |
|---|---|---|
| DE | 102014219849 B3 | 12/2015 |
| EP | 0780698 A1 | 6/1997 |
| JP | H10282200 A | 10/1998 |
| JP | H11512512 A | 10/1999 |
| JP | 2005210015 A | 8/2005 |
| JP | 2006141655 A | 6/2006 |
| JP | 2008035604 A | 2/2008 |
| JP | 2011520087 A | 7/2011 |
| JP | 2012107868 A | 6/2012 |

\* cited by examiner

COOLING DEVICE, COMPRISING A CRYOSTAT AND A COLD HEAD HAVING IMPROVED DECOUPLING TO A COOLING SYSTEM

CROSS REFERENCE TO RELATED APPLICATIONS

This application claims foreign priority under 35 U.S.C. § 119(a)-(d) to German Application No. 10 2016 206 435.5 filed on Apr. 15, 2016, the entire contents of which are hereby incorporated into the present application by reference.

FIELD OF THE INVENTION

The invention relates to a cooling device comprising a cryostat and a cold head of a cooling system, in particular the cold head of a pulse tube refrigerator, the cryostat comprising a vacuum tank, in which at least one cryogen tank for a cryogenic liquid is arranged, the cold head being mounted on the cryostat and a cooling arm of the cold head projecting into an access opening of the cryostat to the cryogen tank, a flexible sealing element, which directly or indirectly connects a wall of the vacuum tank to a room temperature part of the cold head, sealing off the inside of the cryogen tank from the environment, and a connecting line for a working gas of the cooling system, in particular a pressure line for a pulsating working gas, being connected to the cold head. A cooling device of this type is known from DE 10 2014 219 849 B3.

BACKGROUND

Nuclear magnetic resonance (=NMR) apparatuses, in particular NMR spectrometers and NMR tomographs, require strong magnetic fields, which are often generated by using superconducting magnet coils. The superconducting magnet coils must be operated at a cryogenic temperature. For this reason, the magnet coils are typically arranged in a cryogen tank of a cryostat, which is filled with a cryogenic liquid, e.g. liquid helium. In order to maintain the operating temperature on a long-term basis and at the same time minimize the consumption of cryogenic liquids, the cooling arm of a cold head projects into the cryogen tank and heat can be withdrawn thereby. The cryogen tank is surrounded by a vacuum tank for thermal insulation.

The NMR measurements can be disturbed by mechanical vibrations of the NMR apparatus, which are introduced, in particular, via the cold head attached to the cryostat.

In the case of cooling in accordance with the pulse tube refrigerator principle, which is often applied, periodic pressure fluctuations of a working gas are produced in the cold head. For this purpose, a control valve alternately connects a high-pressure reservoir and a low-pressure reservoir of the working gas to the cold head; the switching frequency of the control valve is typically approximately 1 to 2 Hz. Disturbing vibrations at the cold head also occur in other cooling principles (e.g. Stirling, Gifford-McMahon).

In the case of cooling in accordance with the pulse tube refrigerator principle, the working gas is usually connected to the cold head via a flexible connecting line, see e.g. EP 0 780 698 A1. The flexible connecting line minimizes the introduction of high-frequency disturbances in the cold head.

The periodic pressure fluctuations in the flexible connecting line, which periodically change the length and possibly the curvature of the flexible connecting line, may, however, lead to corresponding movements of the cold head, which are introduced into the cryostat and disturb the NMR measurements.

It is known from DE 10 2014 214 819 B3 to use two line branches in a pulse tube refrigerator system to connect the control valve and cold head so that, with identical pressure fluctuations in both branches, opposing mutually compensating mechanical forces occur. Thus, application of force on the cold head can be reduced. However, the structure is relatively bulky.

DE 10 2014 219 849 B3 describes suspending the cold head at a cryogen tank wall using vibration-isolating decoupling elements. A flexible sealing element between the vacuum tank wall and the room temperature part of the cold head seals off the inside of the cryogen tank from the environment, so that only a minimum pressure difference exists on either side of the flexible sealing element. The structure reduces force transmission from the cold head to the cryogen tank.

The use of vibration-isolating decoupling elements is, however, comparably expensive and requires trained personnel for adjustment. Moreover, the size of the assembly is not negligible, making use thereof on smaller cryostats more difficult.

SUMMARY

One object of the present invention is to minimize the introduction of mechanical disturbances, emanating from a cooling system, into a cryostat via a cold head. A further object is to minimize this in a simpler and more compact fashion than has been achieved heretofore.

According to one formulation of the invention, these objects are achieved by a cooling device of the type mentioned at the outset, which is characterized in that
the cooling device comprises a pivot bearing, with which the cold head is mounted on the cryostat so as to be rotatable about a rotation axis,
and in that the connecting line is connected to the cold head in such that forces caused by the cooling system act on the cold head via the connecting line at a force application point in a force application direction,
the force application direction being inclined by no more than 40° with respect to the normal of a lever plane containing the rotation axis and the force application point.

Within the context of the present invention it was found that the mechanical disturbances emanating from typical cooling systems, e.g. a pulse tube refrigerator system, are generally subject to pronounced anisotropy when being introduced into the cold head. The anisotropy substantially results from the routing of the connecting line. In particular, the periodic pressure pulses of the working gas of a pulse tube refrigerator system act along the connecting line, flexible portions of the connecting line generally being subject to a change in length and, in case of a curved routing, also a certain stretching (partial straightening of the curve). The amplitude of the deflection of the cold head is typically very small compared to its size. Accordingly, a substantially constant force application point exists at the cold head, at which point a force application in a substantially constant force application direction occurs. The mechanical disturbance thus continuously attempts to force the same movement on the cold head.

According to a further formulation, the invention provides that the connecting line is arranged such that the cold head is mounted on the cryostat so that the cold head can freely execute this substantially constant movement, which is caused by the mechanical disturbance, with respect to the cryostat.

The pivot bearing according to the invention allows the movement to take place as a rotary movement with a negligible frictional resistance. A further decoupling between the cold head and the cryostat is not necessary, and thus is generally not provided. In particular, no decoupling elements needing to be mounted on the cryostat (e.g. "negative stiffness" isolation elements) are required, nor is a compensation chamber needed, to maintain the cold head position in case of air pressure fluctuations. The bearing mechanism according to the invention has a simple design, is easy to service (easy installation and removal of the cold head, minimum adjustment requirements) and compact.

Due to the orientation according to the invention of the force application direction with respect to the normal of the lever plane, the forces caused by the cooling system (in particular shocks caused by pressure waves of the working gas in a flexible line portion of the connection line) are largely, preferably completely, converted into a rotary movement of the cold head, which can take place freely with respect to the cryostat, and is thus not introduced into the cryostat as a disturbance. In the context of the invention, the forces caused by the cooling system thus attempt to move the force application point (in accordance with the force application direction) approximately along a circular path about the rotation axis A (or along a tangent of this circular path at the force application point), so that the cold head can freely follow this movement through use of its pivot bearing. Thus, during operation of the cooling device, an intentional, oscillating rotary movement (rocking movement) of the cold head about its rotation axis with respect to the cryostat takes place (although with a small amplitude).

Due to a minimum pressure difference (in most cases 0 to 50 mbar, often 25 mbar or less), the flexible sealing element is practically stress-free and thus does not transfer any noticeable mechanical disturbances to the cryostat.

If required or desired, the forces caused by the cooling system acting on the cold head can be reduced using known measures, in particular through force-compensating routings of line branches of the connecting line.

Preferably, the force application direction is inclined with respect to the normal of the lever plane by no more than 30° (according to amount), particularly preferably by no more than 15°, very particularly preferably by no more than 10°, or the force application direction extends parallel to the normal of the lever plane.

The rotary movement about the rotation axis A is generally the only degree of freedom of the cold head on the cryostat.

An embodiment of a cooling device according to the invention is particularly preferred in which the rotation axis extends through the center of gravity of the cold head. This prevents an application of force into the rotation axis (bearing axis) or the cryostat when a back and forth swinging motion of the cold head is produced. If, in an alternative embodiment, the rotation axis does not extend through the center of gravity, the center of gravity should be arranged below the rotation axis.

An embodiment is advantageous in which the force application direction is inclined by an angle $\alpha$ of no more than 15°, preferably of no more than 10°, with respect to a bearing plane which extends perpendicularly to the rotation axis and contains the force application point, the force application direction in particular extending in the bearing plane. This minimizes an application of force along the rotation axis into the cryostat.

An embodiment is also advantageous in which the force application direction is inclined by an angle $\beta$ of no more than 35°, preferably of no more than 15°, with respect to a plummet plane which extends perpendicularly to the lever plane and parallel to the rotation axis and through the force application point, the force application direction in particular extending in the plummet plane. This minimizes an application of force into the cryostat perpendicularly to the rotation axis.

In a particularly preferred embodiment, the connecting line comprises at least one flexible portion. The flexible portion helps to prevent the transmission of high-frequency disturbances, which occur or are introduced (e.g. by a rotary valve/control valve or a compressor) at the end of the connecting line remote from the cold head, to the cold head. In this embodiment, the force application direction is typically derived from length changes (in the case of a curved course also from the curvature change) of the at least one flexible portion due to (low-frequency) pressure pulses in the working gas.

An advantageous development of this embodiment provides that the at least one flexible portion extends overall in a straight line and in the force application direction. This allows for very easy and precise adjustment of the force application direction.

In an alternative, advantageous development, it is provided that the at least one flexible portion is curved at least in one subportion and/or extends in different directions in different subportions. Thus, the force application direction can be chosen more freely, and, in particular, adjusted so as to deviate from the course of an end portion (close to the cold head) of the flexible portion. A particularly compact construction is often also possible.

In another development, it is provided that the force application point is arranged at an end of the at least one flexible portion that is close to the cold head. This has proven successful in practice and provides a particularly simple design.

An embodiment is also preferred in which the connecting line is connected, at an end remote from the cold head, to moving components of the cooling system, in particular to a control valve or a compressor. The moving components can be positioned from the cryostat in a distance and connected by the connecting line, so that the connecting line is the only relevant mechanical connection to the cold head or cryostat, the force application of which connection can be easily kept away from the cryostat according to the invention.

An embodiment of the cooling device according to the invention that is also advantageous provides that the room temperature part of the cold head has a diameter DM perpendicular to its longitudinal axis in the region where the flexible sealing element is attached, and that the following applies for a spacing AB of the rotation axis from a sealing plane in which the flexible sealing element is attached to the wall of the vacuum tank:

$$AB \leq 0.4*DM, \text{ preferably } AB \leq 0.3*DM,$$

the rotation axis in particular being arranged in the sealing plane. Thus, in the case of a flexible sealing element which radially bridges a gap between the vacuum tank wall and the room temperature part of the cooling head, a deformation of the sealing element in the event of a rotary movement of the cold head can occur in a substantially axial fashion, and this can be followed by the sealing element without building up stress. The flexible sealing element is generally bulged in the axial direction.

In an advantageous embodiment, the cold head and the cryostat are designed so as to be mutually adjustable along a longitudinal axis of the cold head. Thus, the cold head can be adjusted with respect to the cryostat, in particular in order to prevent contact of the cold head with the cryostat during a rotary movement and to allow for easy adjustment of the required small gaps between the cooling stages of the cold head and the cryostat despite the unavoidable manufacturing tolerances. The pivot bearing is typically secured in fixed position with respect to the cryostat.

In an advantageous embodiment, it is provided that the pivot bearing is designed having two bearing pins which project along the rotation axis from a collar portion of the vacuum tank towards the cold head, and that the bearing pins are each surrounded by a ball bearing, the ball bearings being rigidly connected to the cold head. The ball bearings can rotate around the round bearing pins with minimum friction in order to execute the disturbance-free rotary movement of the cold head with respect to the cryostat. The disturbance is not transmitted to the cryostat. The bearing pins can be designed so as to be retractable along the rotation axis for assembly or disassembly of the cold head.

A development of this embodiment is also advantageous in which the ball bearings are arranged in a retaining ring which is adjustable with respect to the cold head along the longitudinal axis of the cold head by one or more adjusting elements. This makes it possible to easily adjust the cold head position with respect to the cryostat. The adjusting elements can, for example, be formed as adjusting screws. Alternatively, it is also possible to form the bearing pins on the cryostat so as to be adjustable along the longitudinal axis of the cold head or along a longitudinal axis of the access opening of the cryostat; in this case, the ball bearings can be arranged on the cold head in a stationary fashion.

An alternative embodiment provides that the pivot bearing is designed having two bearing extensions which project from a collar portion of the vacuum tank towards the cold head, and that the bearing extensions are designed having at least two point-shaped or line-shaped supports which lie on the rotation axis A. This manner of mounting has particularly low-friction and the cold head can be easily placed on the bearing extensions from above.

In a preferred embodiment, the rotation axis extends horizontally. This allows for easy positioning of the cold head in the vertical direction from above so as to hang into a cryostat.

The scope of the present invention also covers an NMR measurement assembly comprising a cooling device according to the invention and described above, a magnet coil assembly in the cryogen tank, and an RF resonator surrounding a sample space in a room temperature bore of the cryostat. The NMR measurement assembly can be operated in a particularly disturbance-free manner.

Further advantages of the invention can be found in the description and the drawings. Likewise, the features mentioned above and below may be used either individually or collectively in desired combination. The embodiments shown and described are not to be understood as an exhaustive list, but instead are of an exemplary nature for describing the invention.

BRIEF DESCRIPTION OF THE DRAWINGS

The invention is illustrated in the drawing and is explained in more detail with reference to embodiments. In the drawing.

DETAILED DESCRIPTION

Figure 1A:
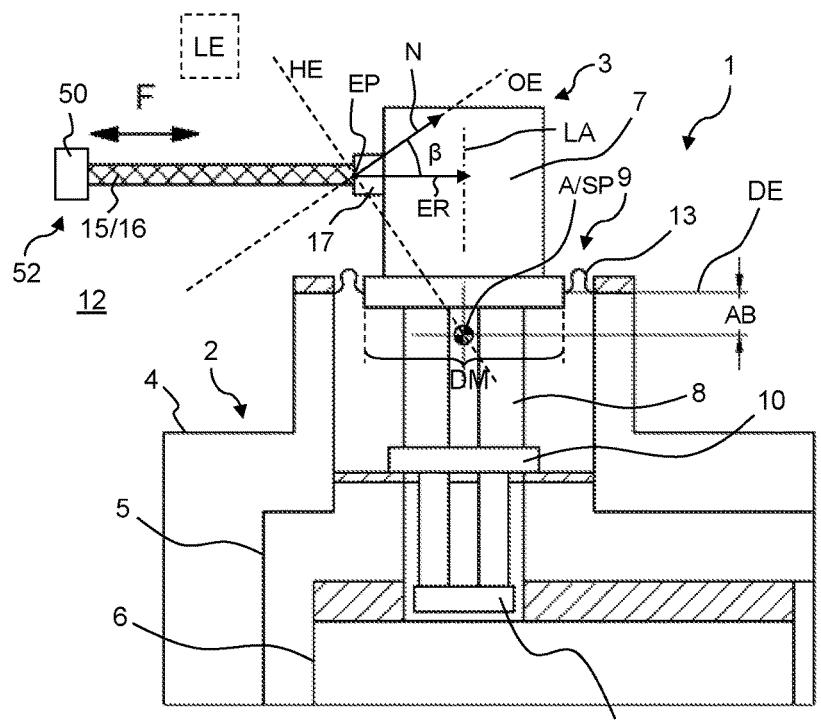
FIG. 1A is a schematic cross-sectional view of a first embodiment of a cooling device according to the invention, comprising a horizontal connecting line.

FIG. 1A is a schematic cross-sectional view of a detail of a first embodiment of a cooling device 1 according to the invention.

The cooling device 1 comprises a cryostat 2 and a cold head 3. The cryostat 2 forms a vacuum tank 4, the inside of which is evacuated. In this case, a radiation shield 5 is formed in the vacuum tank 4 and surrounds a cryogen tank 6. The cryogen tank 6 is filled with a cryogenic liquid, here liquid helium (not shown), and cools a superconducting magnet coil assembly (also not shown, but see FIG. 7) of an NMR spectrometer arranged in the cryogen tank 6.

The cold head 3 comprises a room temperature part 7 projecting beyond the cryostat 2, and a cooling arm 8 which projects into an access opening 9 of the cryostat 2 (here from above). In the embodiment shown, a first cooling stage 10 is coupled to the radiation shield 5 in a contact-free fashion (the small spacing of the first cooling stage 10 from the upper boundary 14 of the internal part of the vacuum tank 4 is not explicitly shown, but see FIG. 3), and a second cooling stage 11 of the cold head 3 projects into an upper opening of the cryogen tank 6.

The environment of the cooling arm 8 is surrounded by gaseous helium which has a slightly higher pressure than the (air-filled) environment 12, e.g. a pressure which is 20 mbar higher than the environment. A flexible sealing element 13, which seals off the inside of the cryogen tank 6 from the environment 12, is attached to the upper edge of the wall of the vacuum tank 4 and on a bottom edge of the room temperature part 7 of the cold head 3. Due to the slightly higher helium pressure in the inside compared to the ambient pressure, the flexible sealing element 13 bulges slightly outwards, but is not under notable mechanical stress.

Figure 3:
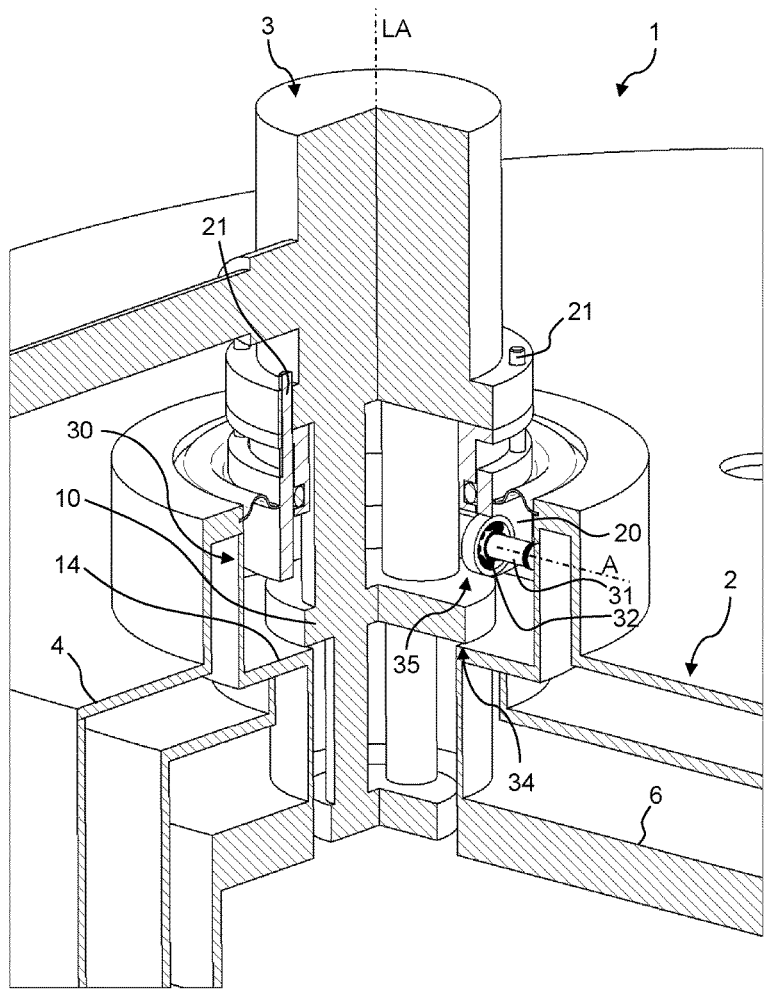
FIG. 3 is a schematic, partly sectional, isometric view of a third embodiment of a cooling device according to the invention, comprising a ball bearing in the retaining ring of the cold head for surrounding two bearing pins.
Figure 4:
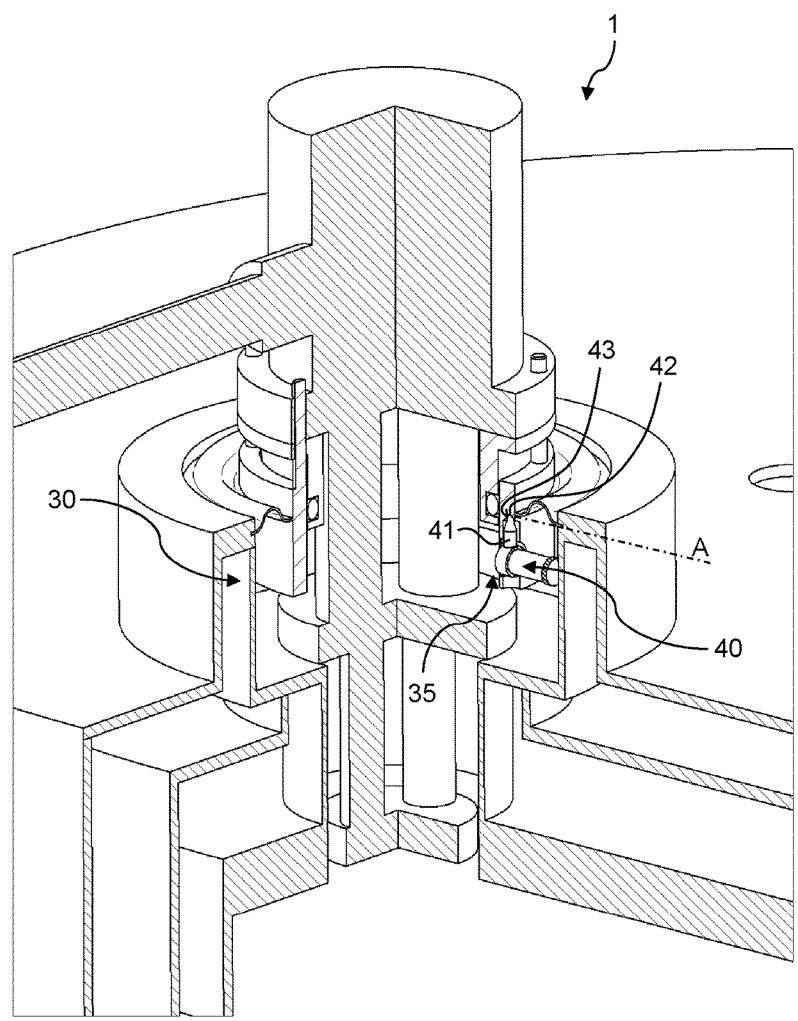
FIG. 4 is a schematic, partly sectional, isometric view of a fourth embodiment of a cooling device according to the invention, comprising point-shaped supports at bearing extensions.

The cold head 3 is mounted on the cryostat 2 via a pivot bearing (not shown in more detail, but see FIGS. 3 and 4).

The cold head 3 is correspondingly freely rotatable about a rotation axis A with respect to the cryostat 2; in the position shown, the longitudinal axis LA of the cold head 3 is oriented in parallel with the vertical (vertical position). However, the maximum angle of rotation of the cold head 3 is restricted to a narrow angle range around its central position (here vertical position), typically to +/−5° or less, before the cold head 3 hits the cryostat 2 (approximately the edge of the opening of the cryogen tank 6). In this case, the rotation axis A extends through the center of gravity SP of the cold head 3.

The cold head 3 is part of a cooling system 52, namely a pulse tube refrigerator. A control valve 50 alternately (at approximately 1-2 Hz) applies a high pressure and a low pressure of a working gas (in most cases helium) to the cold head 3 via a connecting line 15. In the embodiment shown, a straight horizontal flexible line portion 16 of the connecting line 15 arrives at a flange 17 on the cold head 3. The pressure fluctuations alternately cause expansions and contractions of the flexible line portion 16 in its longitudinal direction, which alternately cause a compression force and a tensile force at the connection of the flexible line portion 16 at the cold head 3.

Due to the pressure shocks of the working gas, a force correspondingly acts periodically on the cold head 3 in a force application direction ER at a force application point EP.

The force application direction ER forms an angle $\gamma$ with a normal N on a lever plane HE. The normal is perpendicular to the lever plane; an end point of the normal N is positioned on the force application point EP. The lever plane HE contains the rotation axis A and the force application point EP.

In the embodiment shown, the force application direction ER is in a bearing plane LE. The bearing plane LE extends perpendicularly to the rotation axis A and contains the force application point EP. Thus, in this case the angle $\gamma$ equals an angle $\beta$ which is measured between the force application direction ER and a plummet plane OE, the plummet plane OE extending perpendicularly to the lever plane HE and the parallel to the rotation axis and containing the force application point EP. Note that the plummet plane OE is further perpendicular to the bearing plane LE.

In the embodiment shown, the angle $\gamma$ or $\beta$ is approximately 30°, and therefore the major part of the force application acts in the direction of the normal N. The pivot bearing allows the cold head 3 to execute a rotary movement with respect to the cryostat 2 about the rotation axis A following said major part of the force application. As the rotary movement occurs freely, no force is introduced thereby into the cryostat 3 via the pivot bearing.

It should be noted that smaller angles $\gamma$ of the force application direction ER with respect to the normal N of the lever plane HE can further reduce remaining forces acting on the cryostat 3 via the pivot bearing. The angle $\gamma$ is thus preferably selected so as to be as small as possible.

A spacing AB of the rotation axis A from a sealing plane DE, in which the flexible line portion 13 is attached (directly or indirectly) to the wall of the vacuum tank 4, should be small compared to the diameter DM of the room temperature part 7 of the cold head 3, where the flexible line portion 13 is attached to the room temperature part 7, or compared to the diameter DM of the room temperature part 7 in the sealing plane DE. In the present example, AB is selected to be approximately 0.2*DM. Thus, the edges of the room temperature part 7, where the flexible sealing element 13 is attached, are raised and lowered substantially only axially during the rotary movement, and only minimally moved vertically, which allows for the flexible sealing element 13 to be easily kept stress-free.

Figure 1B:
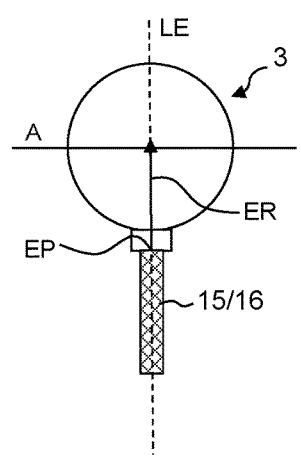
FIG. 1B is a schematic top view of the cold head of the cooling device of FIG. 1A, comprising a connecting line extending in the bearing plane.

FIG. 1B is a top view of the cold head 3 of FIG. 1a. As can be clearly seen, the flexible portion 16 of the connecting line 15 extends in the bearing plane LE, and an angle $\alpha$ between the bearing plane LE and the force application direction ER is 0° here. Thus, force application into the cryostat along the rotation axis (bearing axis) A is prevented.

Figure 1C:
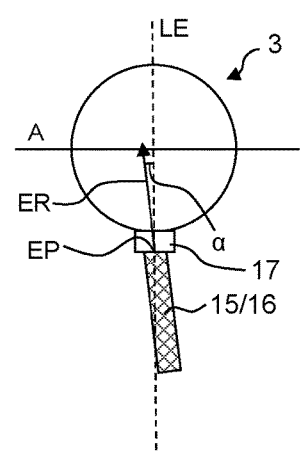
FIG. 1C is a schematic top view of a cold head of a cooling device, in a variant comprising a connecting line extending at an angle to the bearing plane.

If the force application direction ER forms a non-vanishing angle $\alpha$ with the bearing plane LE, see FIG. 1C, e.g. due to the flexible portion 16 of the connecting line 15 arriving at the flange 17 of the cold head 3 at an angle, a certain force application into the cryostat along the rotation axis A may occur. Therefore, the angle $\alpha$ is selected so as to be as small as possible in order to minimize this force application.

It should be noted that the angle $\gamma$ to the perpendicular of the lever plane can have an element from $\alpha$ and an element from $\beta$.

Figure 2:
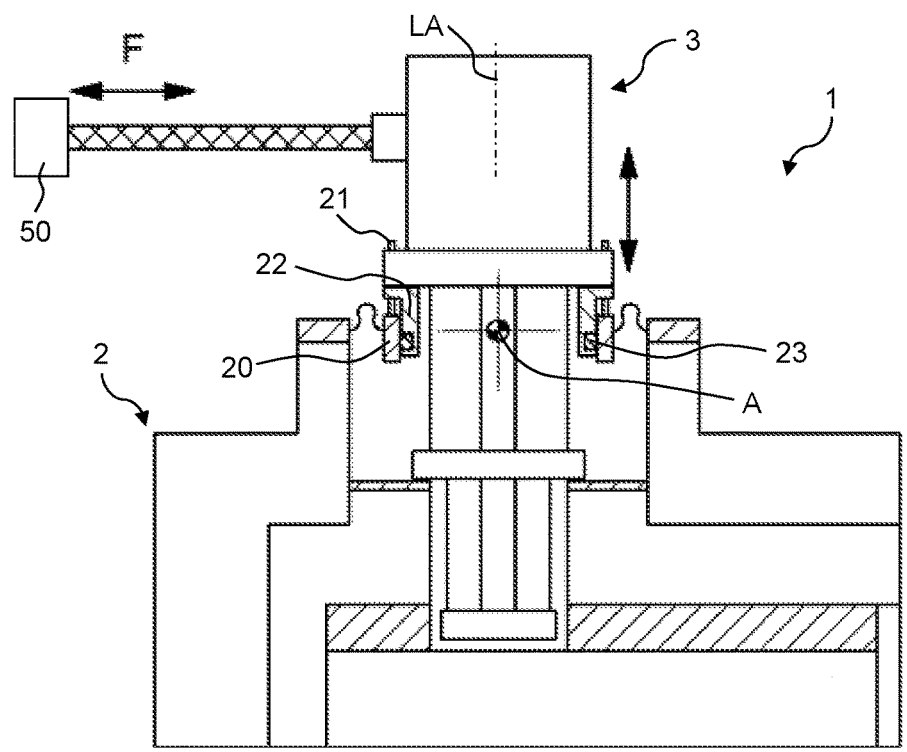
FIG. 2 is a schematic cross-sectional view of a second embodiment of a cooling device according to the invention, comprising a height-adjustable cold head.

FIG. 2 illustrates a second embodiment of a cooling device 1 according to the invention which is similar to the first embodiment of FIG. 1, and therefore only substantial differences are explained.

Here, the cooling device 1 is designed having a retaining ring 20 which is mounted on the cryostat 2 so as to be rotatable about the rotation axis A. The (remaining) cold head 3 is attached to the retaining ring 20 through adjusting screws 21 so as to be adjustable along the longitudinal axis LA, here substantially vertically. A collar 22 of the cold head 2 is formed on the inside of the retaining ring 20 and is sealed off from the retaining ring 20 with an O-ring 23. If the cold head 2 is vertically adjusted with respect to the retaining ring 20, the O-ring 23 can slide down on the inside of the retaining ring 20.

The adjustability allows for adjustment of the center of gravity of the cold head 3 with respect to the (stationary) rotation axis A, or of the position of the cold head 3 with respect to the cryostat 2, in order to prevent mutual contact.

FIG. 3 is a schematic, partly sectional view of a third embodiment of a cooling device 1 according to the invention which is similar to the embodiment of FIG. 2, and therefore only the substantial differences are explained. In this view, the pivot bearing 35 for the cold head 3 is clearly visible.

Two opposing bearing pins 31 having a circular cross section portion (in FIG. 3 only one of them is shown) project inwards from a collar portion 30 of the vacuum tank 4 towards the cold head 3. The bearing pins 31 extend along the rotation axis A. The bearing pins 31 are each surrounded by a ball bearing 32. The ball bearings 32 are formed in a retaining ring 20, on which the cold head 3 is mounted. The retaining ring 20 can be moved with respect to the cold head 3 along the longitudinal axis LA of the cold head 3 by a plurality of adjusting screws 21. A collar 22 of the cold head 3 comprising an O-ring 23 seals off the cold head 3 from gaseous helium from the cryogen tank 6.

In FIG. 3, a gap 34 between the first cooling stage 10 and the upper boundary 14 of the internal part of the vacuum tank 4 is also clearly visible.

FIG. 4 is a schematic, partly sectional view of a fourth embodiment of a cooling device 1 according to the invention which is similar to the embodiment of FIG. 3, and therefore only the substantial differences are explained.

Here, the pivot bearing 35 is designed having two opposing bearing extensions 40 (of which only one is shown in FIG. 4) which project inwards from a collar portion 30. The bearing extensions 40 are substantially L-shaped, point-shaped supports 42 being formed in this case at each top end of conical vertical struts 41. The supports 42 rest in the retaining ring 20 in approximately conical recesses 43 which are open at the bottom. Thus, the cold head 3 can be swiveled or rotated around the rotation axis A, which extends through the point-shaped supports 42.

Figure 5:
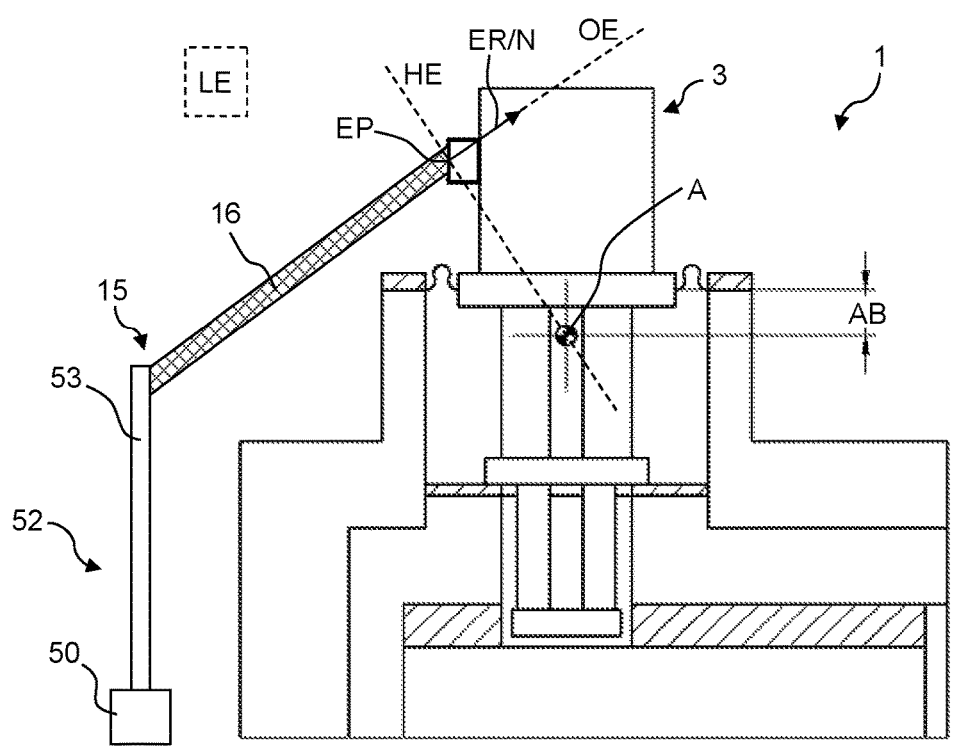
FIG. 5 is a schematic cross-sectional view of a fifth embodiment of a cooling device according to the invention, comprising a flexible portion in the connecting line that extends at an angle with respect to the horizontal.

FIG. 5 shows a fifth embodiment of a cooling device 1 according to the invention, which largely corresponds to the embodiment of FIG. 1a, and therefore only the substantial difference are explained in the following.

In this embodiment, the connecting line 15 comprises a rigid portion 53 and a flexible portion 16. The flexible portion 16 extends at an angle to the horizontal. Thus, it can be set so as to be approximately vertical with respect to the lever plane HE. Pressure-induced lengthening and contraction of the flexible portion 16, triggered by the control valve (rotary valve) 50 of the cooling system 52 (here a pulse tube refrigerator system), then causes a force on the cold head 3 in the force application direction ER, which extends along the normal N of the lever plane HE. The force application direction ER thus forms an angle of $\beta=0°$ with the plummet plane OE.

The angle $\alpha$ of the force application direction ER with respect to the bearing plane LE is also 0° here (not shown in more detail), so that virtually no forces are introduced by the cooling system 52 via the pivot bearing into the cryostat 2.

Figure 6:
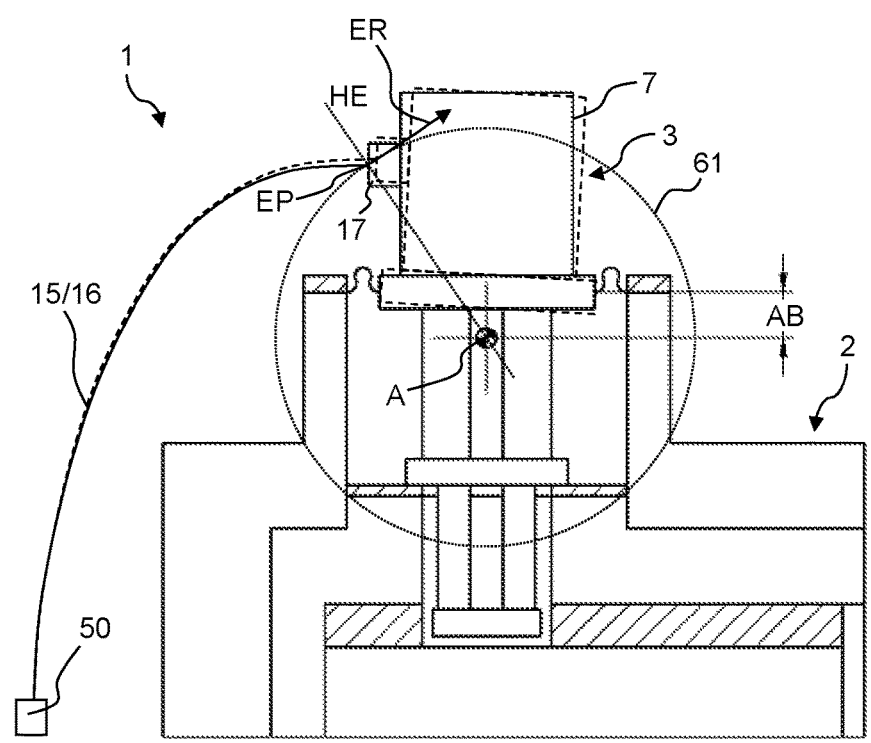
FIG. 6 is a schematic cross-sectional view of a sixth embodiment of a cooling device according to the invention, comprising a curved flexible portion in the connecting line.

FIG. 6 shows a sixth embodiment of a cooling device 1 according to the invention which is similar to the embodiment of FIG. 1a, and therefore only the substantial differences are explained.

In this case, a curved flexible portion 16 of the connecting line 15 extends from the control valve 50 to the flange 17 of the cold head 3. Pressure pulses of the working gas in the flexible portion 16 not only lengthen (and contract) said portion, but also stretch it, i.e. the curvature is reduced. Thus, the force application direction ER deviates from the direction of the course of the end of the flexible portion 16 close to the cold head.

The flexible portion 16 is preferably set in such way (in particular with respect to its axial stiffness and its curvature) that, due to the pressure pulses, the end point of the flexible line portion 16, which corresponds to the force application point EP, is guided on a circular path 61 about the axis A (or approximately on a tangent of this circular path), even if the end point was not attached to the cold head 3 ("tangential force application direction"). After the flexible portion 16 is attached to the cold head 3, the cold head 3 is then merely rotated freely about the rotation axis A due to the force application of the pressure pulses, and approximately no forces are transferred to the cryostat 2 via the pivot bearing. The force application direction ER then again extends along the normal of the lever plane HE, departing from the force application point EP.

In FIG. 6, a rotated position of the room temperature part 7 of the cold head 3 and the associated stretched position of the flexible line portion 16 is shown by dashed lines.

A similar mechanical effect as that due to a curved flexible portion of the connecting line can also be achieved by two straight flexible line portions, which are at an angle to each other and are positioned one behind the other (not shown in more detail).

Figure 7:
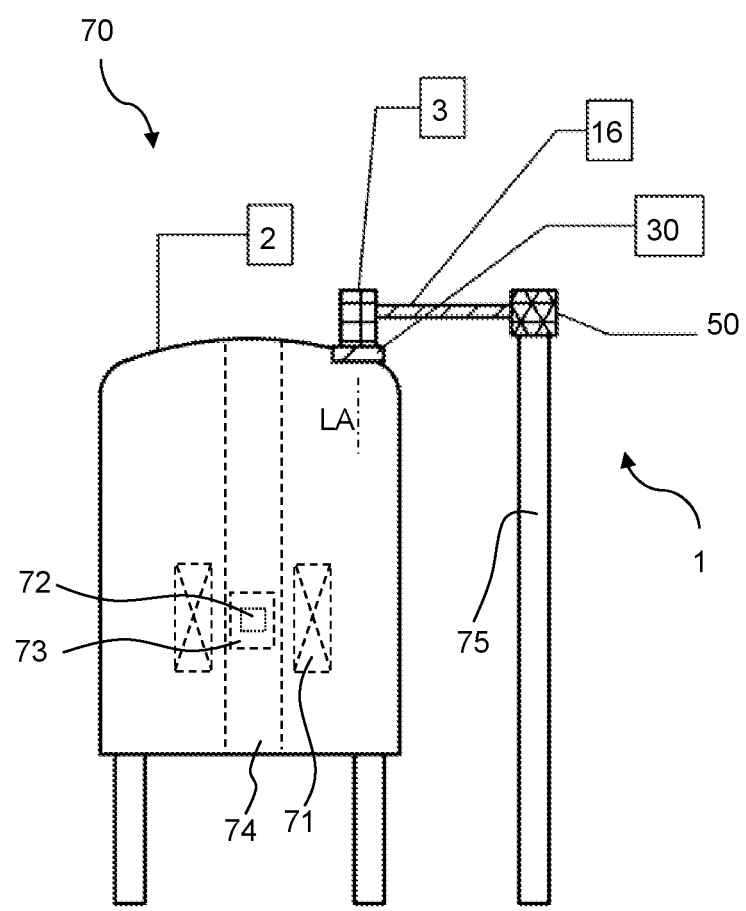
FIG. 7 is a schematic side view of an NMR measurement assembly according to the invention.

FIG. 7 is a schematic side view of an NMR measurement assembly 70 according to the invention, here a high-resolution NMR spectrometer, in which a cooling device 1 according to the invention, e.g. as shown in FIG. 1a, is installed. This cooling device comprises a cryostat 2, the cryogen tank (not shown in more detail) of which accommodates a superconducting magnet coil assembly 71. This magnet coil assembly generates a homogenous static magnetic field $B_0$ in a sample space 72. Using an RF resonator 73, RF pulses can be radiated into the sample space 72 or a sample arranged here, and the resulting signals emitted by the sample can be detected. The sample space 72 and the RF resonator 73 are arranged in a room temperature bore 74, in this case vertical, of the cryostat 2. A cryogenic liquid in the cryogen tank of the cryostat 2 is cooled with a projecting, rotatably mounted cold head 3, which is connected to a control valve 50 via the flexible portion 16 of a connecting line, which is here arranged on a rigid support 75. The control valve 50 alternately connects a high-pressure reservoir and a low-pressure reservoir of a working gas to the cold head 3 in accordance with the pulse tube refrigerator principle.

What is claimed is:

1. A cooling device comprising:
   a cryostat and a cold head of a cooling system,
      wherein the cryostat comprises a vacuum tank in which at least one cryogen tank for a cryogenic liquid is arranged,
      wherein the cold head is mounted on the cryostat, and comprises a cooling arm that projects into an access opening of the cryostat and to the cryogen tank,
   a flexible sealing element, which connects a wall of the vacuum tank to a room temperature part of the cold head, sealing off an interior space of the cryogen tank from the environment,
   a connecting line for a working gas of the cooling system, connected to the cold head, and
   a pivot bearing configured to mount the cold head on the cryostat rotatably about a rotation axis,
   wherein the connecting line is connected to the cold head such that forces caused by the cooling system act on the cold head via the connecting line at a force application point in a force application direction, the force application direction being inclined by no more than 40° with respect to the normal of a lever plane which contains the rotation axis and the force application point.

2. The cooling device according to claim 1, wherein the rotation axis extends through the center of gravity of the cold head.

3. The cooling device according to claim 1, wherein the force application direction is inclined by an angle $\alpha$ of no more than 15° with respect to a bearing plane which extends perpendicularly to the rotation axis and contains the force application point.

4. The cooling device according to claim 1, wherein the force application direction is inclined by an angle $\beta$ of no more than 35° with respect to a plummet plane which extends perpendicularly to the lever plane and parallel to the rotation axis and through the force application point.

5. The cooling device according to claim 1, wherein the connecting line comprises at least one flexible portion.

6. The cooling device according to claim 5, wherein the at least one flexible portion extends in a straight line and in the force application direction.

7. The cooling device according to claim 5, wherein the at least one flexible portion is curved at least in one subportion and/or extends in differing directions in differing subportions of the flexible portion.

8. The cooling device according to claim 5, wherein the force application point is arranged at an end of the at least one flexible portion that is proximate to the cold head.

9. The cooling device according to claim 1, wherein the connecting line is connected, at an end remote from the cold head, to moving components of the cooling system.

10. The cooling device according to claim 1, wherein the room temperature part of the cold head has a diameter DM perpendicular to its longitudinal axis in the region where the flexible sealing element is attached, and wherein the following applies for a spacing AB of the rotation axis from a sealing plane in which the flexible sealing element is attached to the wall of the vacuum tank:

$$AB \leq 0.4*DM.$$

11. The cooling device according to claim 1, wherein the cold head and the cryostat are configured to be mutually adjustable along a longitudinal axis of the cold head.

12. The cooling device according to claim 1, wherein the pivot bearing is configured to have two bearing pins which project along the rotation axis from a collar portion of the vacuum tank towards the cold head, and wherein the bearing pins are each surrounded by a respective ball bearing, the ball bearings being rigidly connected to the cold head.

13. The cooling device according to claim 12, wherein the ball bearings are arranged in a retaining ring which is adjustable with respect to the cold head along the longitudinal axis of the cold head with at least one adjusting element.

14. The cooling device according to claim 1, wherein the pivot bearing is configured to have two bearing extensions which project from a collar portion of the vacuum tank towards the cold head, and wherein the bearing extensions are configured to have at least two point-shaped or line-shaped supports which lie on the rotation axis.

15. The cooling device according to claim 1, wherein the rotation axis extends horizontally.

16. An NMR measurement assembly comprising:
  a cooling device that includes
    a cryostat and a cold head of a cooling system,
    wherein the cryostat comprises a vacuum tank in which at least one cryogen tank for a cryogenic liquid is arranged,
    wherein the cold head is mounted on the cryostat, and comprises a cooling arm that projects into an access opening of the cryostat and to the cryogen tank,
    a flexible sealing element, which connects a wall of the vacuum tank to a room temperature part of the cold head, sealing off an interior space of the cryogen tank from the environment,
    a connecting line for a working gas of the cooling system, connected to the cold head, and
    a pivot bearing configured to mount the cold head on the cryostat rotatably about a rotation axis,
    wherein the connecting line is connected to the cold head such that forces caused by the cooling system act on the cold head via the connecting line at a force application point in a force application direction, the force application direction being inclined by no more than 40° with respect to the normal of a lever plane which contains the rotation axis and the force application point,
  a magnet coil assembly in the cryogen tank, and
  a radio-frequency resonator surrounding a sample space in a room temperature bore of the cryostat.

17. The cooling device according to claim 1, wherein the cold head is a cold head of a pulse tube refrigerator, and wherein the connecting line for the working gas of the cooling system is a pressure line for a pulsating working gas.

18. The cooling device according to claim 3, wherein the force application direction is inclined by an angle $\alpha$ of no more than 10°, and wherein the force application direction extends in the bearing plane.

19. The cooling device according to claim 4, wherein the force application direction is inclined by an angle $\beta$ of no more than 15° with respect to a plummet plane which extends perpendicularly to the lever plane and parallel to the rotation axis and through the force application point.

20. The cooling device according to claim 4, wherein the force application direction extends in the plummet plane.

21. The cooling device according to claim 9, wherein the connecting line is connected, at the end remote from the cold head, to a control valve or a compressor of the cooling system.

22. The cooling device according to claim 10, wherein $AB \leq 0.3*DM$, and wherein the rotation axis is arranged in the sealing plane.

* * * * *